US007358581B2

United States Patent
Kurtz et al.

(10) Patent No.: US 7,358,581 B2
(45) Date of Patent: Apr. 15, 2008

(54) QUANTUM DOT BASED PRESSURE SWITCH

(75) Inventors: Anthony D. Kurtz, Saddle River, NJ (US); Boaz Kochman, New York, NY (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 178 days.

(21) Appl. No.: 11/281,093

(22) Filed: Nov. 17, 2005

(65) Prior Publication Data

US 2007/0108434 A1 May 17, 2007

(51) Int. Cl.
*H01L 29/84* (2006.01)
(52) U.S. Cl. .............................. 257/419; 257/E29.069; 257/417
(58) Field of Classification Search ................ 257/417, 257/E29.069, 419; 438/415
See application file for complete search history.

(56) References Cited

U.S. PATENT DOCUMENTS 6,498,354 B1 * 12/2002 Jefferson et al. .............. 257/24

6,727,524 B2 * 4/2004 Kurtz .......................... 257/104

OTHER PUBLICATIONS

Liu et al., Strain-Induced Quantum Ring Hole States in a Gated Vertical Quantum Dot, Phys. Rev. Lett. 89, pp. 096804-1 to 096804-4.*
Yakimov et al., Longitudinal conductivity of Ge/Si heterostructures with quantum dots, JETP Lett. 63, pp. 444-447.*
Zhuang, L., Guo L. and Chou, S. Y., "Silicon Single-Electron Quantum Dot Transistor Switch Operating at Room Temperature," Applied Physics Letter, vol. 10, p. 1205, 1998.
Singh, J., Physics of Semiconductors and Their Heterostructures, (McGraw-Hill, New York, 1993), p. 229 to 239.

* cited by examiner

Primary Examiner—Matthew C. Landau
Assistant Examiner—Minchul Yang
(74) Attorney, Agent, or Firm—The Plevy Law Firm

(57) ABSTRACT

A semiconductor heterostructure based pressure switch comprising: first and second small bandgap material regions separated by a larger bandgap material region; a third small bandgap material region within the region of larger bandgap material, the third material region and larger bandgap material region defining at least one quantum dot; and, first and second electrodes electrically coupled to the first and second small bandgap material regions, respectively, wherein the electrodes are sufficiently proximate to said quantum dot to facilitate electron tunneling there between when a pressure is applied to the bandgap material defining the quantum dot.

19 Claims, 2 Drawing Sheets

QUANTUM DOT BASED PRESSURE SWITCH

FIELD OF THE INVENTION

The present invention relates generally to pressure sensors, and more particularly to pressure activated switches.

BACKGROUND OF THE INVENTION

Quantum dots are a well known phenomena and have been employed to fabricate various optoelectronic devices including semiconductor lasers, optical amplifiers, light emitting diodes, digital circuits and the like. Generally, quantum dots are formed in III-V elements. (See, e.g. text entitled "Self Assembled InGaAs/GaAs Quantum Dots" by Robert Willardson et al. and published by Academic Press (1999) ISBN-0-12-75169-0.) The text includes many examples of how quantum dots embedded in semiconductor substrates are also commercially available. For example, Evident Technologies of Troy, N.Y. sells semiconductor materials such as InP having quantum dots (see, e.g. www-.evidentech.com). Devices employing quantum dots are capable of high speed operations as compared to conventional semiconductor devices.

It is known to be desirable to sense pressing, or pressure, exerted on certain structures. It is further known to be desirable to provide switches that have sharp response curves to such pressing or pressures as they traverse a desired transition pressure, such that there is a highly focused transition between switching states at the transition pressure. The present invention contemplates a quantum dot pressure device exhibiting high speed operation and selective switching in response to a sensed pressure.

SUMMARY OF THE INVENTION

According to an aspect of the present invention, a semiconductor heterostructure based pressure switch comprising: first and second small bandgap material regions separated by a larger bandgap material region; a third small bandgap material region within the region of larger bandgap material, the third material region and larger bandgap material region defining at least one quantum dot; and, first and second electrodes electrically coupled to the first and second small bandgap material regions, respectively, wherein the electrodes are sufficiently proximate to said quantum dot to facilitate electron tunneling there between when a pressure is applied to the bandgap material defining the quantum dot.

According to another aspect of the invention, a pressure switch comprises a semiconductor substrate having a thinned portion indicative of an active area which will deflect upon application of a force thereto. The substrate comprises carriers, and a quantum dot is formed in the substrate and within the active area, whereby when the force is applied to the active area, the quantum dot and the substrate exhibit a transition to enable a current to flow through the substrate proportional to the magnitude of the applied force.

BRIEF DESCRIPTION OF THE FIGURES

Understanding of the present invention will be facilitated by considering the following detailed description of the preferred embodiments of the present invention taken in conjunction with the accompanying drawings, in which like numerals refer to like parts, and.

DETAILED DESCRIPTION OF THE PREFERRED EMBODIMENTS

Figure 1:
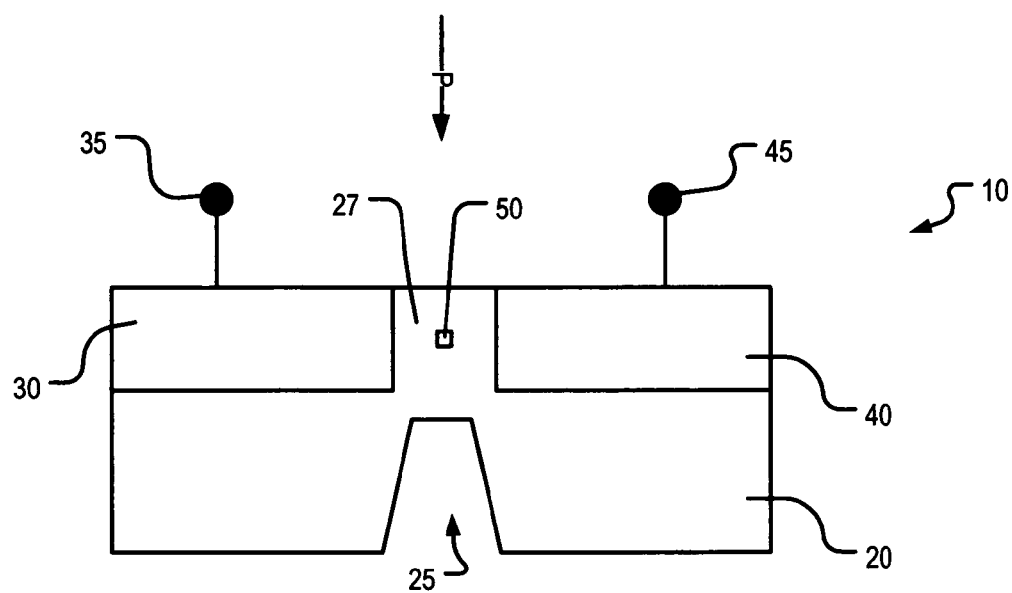
FIG. 1 illustrates a schematic representation of a pressure switch according to an aspect of the present invention.

It is understood that the figures and descriptions of the present invention have been simplified to illustrate elements that are relevant for a clear understanding of the present invention, while eliminating, for the purpose of clarity, other elements found in typical pressure sensing systems and methods of making and using the same. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Epitaxial techniques may be used to produce semiconductor based structures having abrupt changes in semiconductor materials, such that the change from one material to another occurs on the order of one molecular monolayer (on the order of a few Angstroms). Where the two or more disparate materials have different bandgaps, such semiconductor structures are conventionally known as heterostructures. The bandgap is the energy difference between the top of the valence band and the bottom of the conduction band in semiconductors. Due to the energy difference across a bandgap, an energy barrier for carriers (e.g. electrons or holes) is typically created in the smaller-bandgap material. For purposes of explanation, the present invention will be discussed as it relates to the carriers of interest being electron carriers, however, it should be understood that an alternative implementation may be carried out using hole carriers.

If the energy barrier is significantly larger than the thermal energy (kT) of the carriers where (k is Boltzmann's constant and T is the absolute temperature), the carriers are effectively confined to the smaller-bandgap material. If the region of confinement is sufficiently small (i.e., on the order of the wavelength of an electron or about 20 nanometers (nm) or less), quantum effects play a significant role. In this case, not only are the electrons confined to the smaller bandgap material region, but also to specific energy levels rather than the entire energy continuum that is available to electrons in large structures, due to energy quantization.

Where the sufficiently small confinement is only in one dimension, the structure is commonly known as a quantum well. That is, in a quantum well particles are confined in one dimension, forcing them to occupy a planar region. Quantum confinement takes place when the quantum well thickness becomes comparable to the de Broglie wavelength of the carriers, leading to energy levels called "energy subbands", wherein, the carriers only have discrete energy values.

Where sufficiently small three-dimensional (3-D) confinement is provided, the structure is commonly known as a quantum dot. Thus, in a quantum dot, electrons, holes, or electron-hole pairs are confined in three dimensions. The confinement region may be on the order of a few nanometers up to a few hundred nanometers, which leads to quantized energy levels and to the quantization of charge in units of the elementary electric charge. The structure and theory of operation of quantum dots is well known.

In a quantum structure, varying the confinement dimension as well as the barrier height controls the number and values of the supported discrete energy levels. In addition to confinement area size and energy barrier height, strain can be used to vary the discrete energy level values. The quantitative effect of the strain on the energy levels can be predicted using deformation potential theory. The details of the calculation depend on the nature of the particular semiconductor and whether electrons or holes are being implemented. In the case of electrons in direct-bandgap semiconductors, such as GaAs or InAs, the change in energy level $\Delta E$ produced by strain is given by:

$$\Delta E = \Xi^{(000)}(\epsilon_{xx} + \epsilon_{yy} + \epsilon_{zz}) \quad (1)$$

where $\Xi^{(000)}$ is the dilation deformation potential for the direct bandgap conduction band valley, which depends on the particular material being strained, and $\epsilon_{xx}$, $\epsilon_{yy}$, and $\epsilon_{zz}$ are the components of the strain tensor in the x, y, and z directions, respectively. Similar equations have been derived for indirect bandgap semiconductors, such as silicon (Si) and germanium (Ge), as well as for strain effects in the valence (hole) band.

According to an aspect of the present invention, a highly sensitive pressure switch that uses the change of the energy band levels with applied strain may be provided. A cross-sectional schematic of such a device 10 is shown in FIG. 1. Device 10 generally includes a substrate 20. In an exemplary configuration, substrate 20 includes a thinned region that defines a diaphragm 25. Substrate 20 supports an emitter region 30 and collector region 40. Electrode 35 is electrically coupled to emitter 30, and electrode 45 is electrically coupled to collector region 40. Substrate 20 also includes a portion 27 positioned between emitter and collector regions 30, 40. Portion 27 is generally vertically aligned with diaphragm 25. Portion 27 has at least one quantum dot 50 formed therein. An operating potential can be applied to electrodes 35 and 45 to bias the device.

Quantum dot 50 is typically made of a small bandgap material, such as Ge or SiGe (the bandgap of Ge is around 0.67 eV, the bandgap of SiGe varying according to the respective compositions of the Si and Ge, but typically around 0.91 eV for a SiGe composition of (50% Ge, 50% Si)), and is surrounded by a larger bandgap material such as Si (the bandgap of silicon is around 1.14 eV). Of course, other material systems providing for a suitable bandgap differences may be used, such as AlAs/GaAs, GaAs/InAs, InGaAs/GaAs, InP and other heterostructure materials.

Substrate 20 is typically made of the larger bandgap material, such as Si. In the embodiment illustrated in FIG. 1, diaphragm 25 is etched in the backside of substrate 20 so that an applied force or pressure (P) applied to the top surface of the device is transferred to dot 50 as a strain. The thickness of diaphragm 25 can be varied to provide for a range of strains depending on the pressure range of interest. The diaphragm 25 deflects upon application of a force or pressure, P, thereto.

Emitter and collector regions 30, 40 are typically made of the smaller bandgap material, such as Ge. Electrodes 35, 45 are placed sufficiently close to quantum dot 50 so that quantum tunneling of electrons from the electrodes 35, 45 is facilitated. As indicated, the construction of such devices as shown in FIG. 1 can be implemented by many different techniques. In an exemplary configuration, emitter and collector regions 30, 40 have a doping density of about $10^{18}$ or $10^{19}$ carriers/cm$^3$ or higher, a substrate thickness and diaphragm thickness of about 5 mils and about 0.25-2 mils, respectively, with the thickness varying according to the pressure to be measured (e.g. thinner diaphragm for smaller pressures); the quantum dot being about 10 nanometers (nm) in size, with the spacing between the quantum dot and corresponding edge of each respective emitter/collector region on the order of 1-10 nm, and typically about 5 nm.

Figure 2:
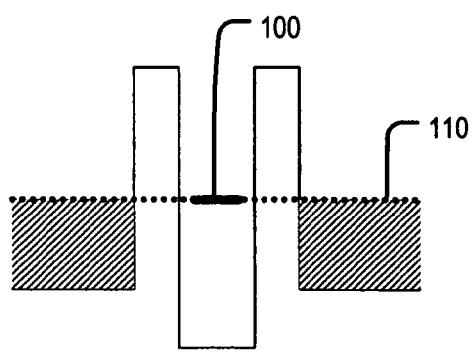
FIG. 2 illustrates an energy diagram of the switch of FIG. 1 in a first switch state according to an aspect of the present invention.
Figure 3:
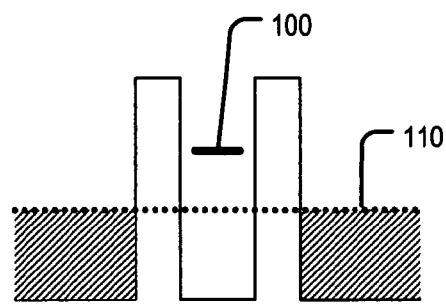
FIG. 3 illustrates an energy diagram of the switch of FIG. 1 in a second switch state according to an aspect of the present invention; and, FIG. 4 illustrates a response curve of the switch of FIG. 1 according to an aspect of the present invention.

FIGS. 2 and 3 illustrate an operational principle of device 10 according to an aspect of the present invention. If the strain induced by pressure P (FIG. 1) is such that the energy level 100 within the dot 50 is aligned with the Fermi Level 110 in the electrodes (FIG. 2), electron tunneling is supported between electrodes 35, 45 and dot 50. If no voltage is applied between electrodes 35, 45, the rate of tunneling in both directions is predicted to be equal such that no net current flows. However, if a small bias voltage is applied, so the collector 40 voltage is slightly higher than the emitter 30 voltage, the tunneling rate from emitter 30 through the dot 50 to collector 40 exceeds the tunneling rate from collector 40 through dot 50 to emitter 30, such that a measurable net current will flow.

On the other hand, if the amount of strain is such that energy level 100 in quantum dot 50 is not aligned with the Fermi Level 110 in the electrodes (FIG. 3), tunneling is not supported between electrodes 35, 45 and dot 50—as electrons at the Fermi energy level 110 of electrodes 35, 45 are not supported by dot 50. In this case, a corresponding small bias voltage between the emitter and collector does not cause current to flow.

Thus, according to an aspect of the present invention, measuring the current between collector 40 and emitter 30 (using electrodes 35, 45, for example) provides an indication of the amount of strain applied to dot 50, and hence the amount of pressure (P, FIG. 1) applied to diaphragm 25 (FIG. 1).

Figure 4:
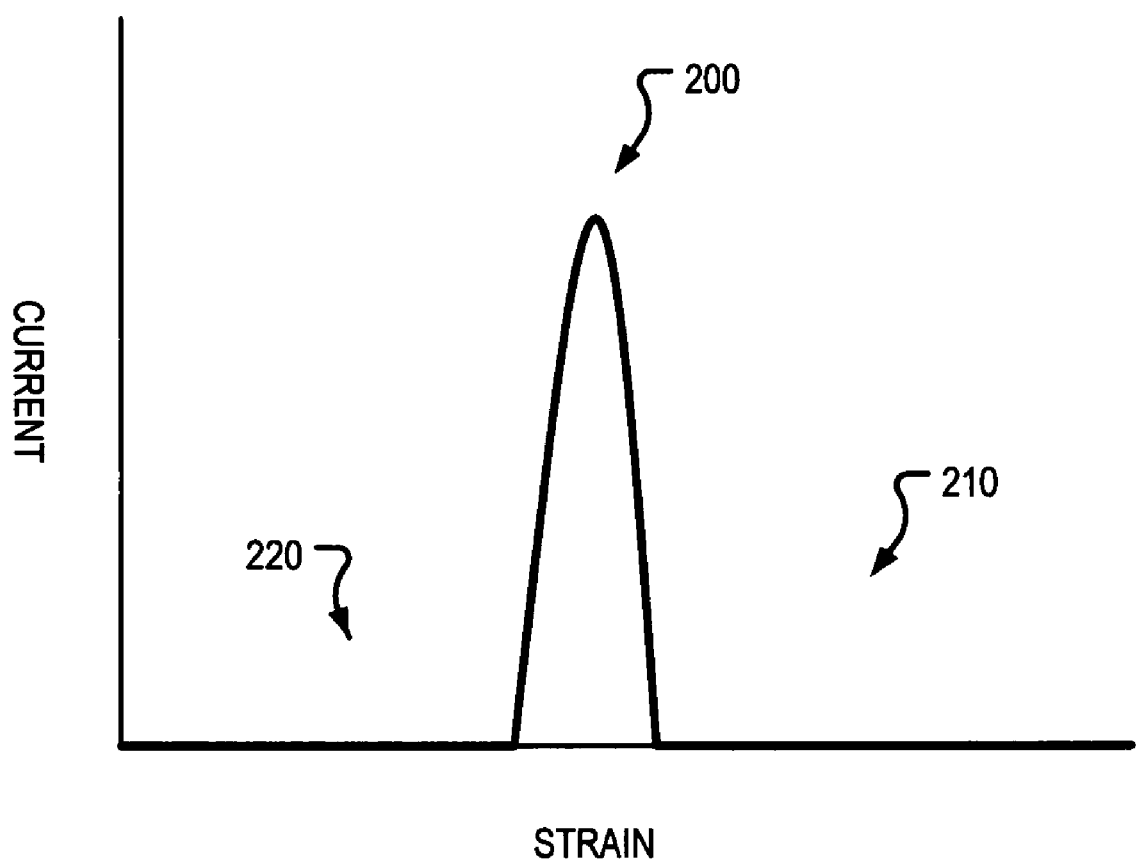

Referring now also to FIG. 4, there is shown an idealized current output as a function of applied strain of a device 10. Where the pressure P (FIG. 1) induced strain is such that energy level 100 is aligned with the Fermi energy level 110 of the collector 40 and emitter 30 (region 200), the net current is high. At other strain values (regions 210, 220) the current is near zero. Thus, the measured current output between electrodes 35, 45 after biasing device 10, provides a good indication of applied pressure P (FIG. 1), such that device 10 may be used as a pressure switch.

In principle, device 10 (FIG. 1) can be designed so that when zero pressure is applied to diaphragm 25 (FIG. 1), the energy levels of quantum dot 50 (FIG. 1) are not aligned with the Fermi levels in the emitter and collector (FIG. 3)—such that no current flows under zero pressure. For measurable current to flow (i.e., to turn "on"the switch), pressure is applied to sufficiently move the energy levels in quantum dot 50 (FIG. 1) into conformance with the Fermi levels of the emitter and collector regions 30, 40 (FIGS. 1, 2). Alternatively, device 10 (FIG. 1) can in principle be designed so that the energy levels are aligned at zero applied pressure (FIG. 3), and pressure must be applied to turn the switch "off" (FIG. 2).

By way of further, non-limiting explanation only, in the case of three dimensional confinement, the smaller the dot the fewer discrete energy levels that are provided, and the more widely spaced these discrete energy levels are. In order for discrete energy states to play a role in the pressure sensing, quantum dot 50 (FIG. 1) should be sufficiently small so that the energy spacing between the levels is significantly larger than the thermal energy—as greater changes in temperature are required to cause an energy level transition than if quantum dot 50 (FIG. 1) were larger. This provides for more energy levels that are more closely spaced to one another. It should also be noted that the changes in effective mass affect the tunneling probability even if quantum dot 50 (FIG. 1) is not sufficiently small for the effect to be measurable.

Thus, according to an aspect of the present invention, a quantum dot sensor can also operate based upon another physical mechanism, not directly relating to the particular discrete energy values in the quantum dot. More particularly, the probability of tunneling through an energy barrier can be approximated by $$P=\exp(-k\sqrt{m}t\sqrt{W}) \quad (2)$$

where P is the tunneling probability, k is a constant (equal to 0.34), m is the relative effective mass of the carrier, t is the thickness of the barrier through which the carrier must tunnel, and W is the height of the energy barrier. From equation (2) it can be seen that any changes in the effective mass of the carriers affects the tunneling probability, and hence the output current of the device. When strain is applied to a semiconductor, the effective mass of the carriers in that semiconductor changes. In piezoresistive sensors, the effective mass affects the carrier mobility and hence changes the resistance of the device. According to an aspect of the present invention, the effective mass change due to applied strain alters the tunneling probability of carriers into and out of quantum dot 50. This in turn changes the output current between collector 40 and emitter 30 and may be used to provide an indication of the experienced strain, and hence applied pressure. Thus, a pressure switch comprises a semiconductor substrate having a thinned portion indicative of an active area which will deflect upon application of a force thereto. The substrate comprises carriers, such as electrons (or holes) and a quantum dot is formed in the substrate and within the active area. When a force is applied to the active area, the quantum dot and the substrate exhibit a transition to enable a current to flow through the substrate proportional to the magnitude of the applied force.

It should also be noted that while the principle of operation of such a pressure sensor may be similar to a single electron transistor, a significant difference lies in the realization that energy levels are moved using an electric field applied via a gate electrode in a single electron transistor, while strain is applied to move the energy levels in the herein-disclosed quantum dot pressure switch.

Those of ordinary skill in the art may recognize that many modifications and variations of the present invention may be implemented without departing from the spirit or scope of the invention. Thus, it is intended that the present invention covers the modifications and variations of this invention.

What is claimed is:

1. A semiconductor heterostructure based pressure switch comprising:
    first and second small bandgap material regions separated by a larger bandgap material region of a substrate having a thinned area defining a deflectable diaphragm;
    a third small bandgap material region within said region of larger bandgap material, said third material region and larger bandgap material region defining at least one quantum dot; and,
    first and second electrodes electrically coupled to said first and second small bandgap material regions, respectively;
    wherein, said at least one quantum dot is aligned with said diaphragm and wherein said electrodes are sufficiently proximate to said quantum dot to facilitate electron tunneling therebetween when a pressure is applied to said bandgap material defining said quantum dot.

2. The switch of claim 1, wherein at least one of said first, second and third regions comprise (Ge).

3. The switch of claim 1, wherein at least one of said first, second and third regions comprise (SiGe).

4. The switch of claim 1, wherein said region of larger bandgap material comprises Si.

5. The switch of claim 1, wherein:
    said first, second and third regions comprise Ge; and,
    said region of larger bandgap material comprises Si.

6. The switch of claim 1, wherein:
    said first, second and third regions comprise SiGe; and,
    said region of larger bandgap material comprises Si.

7. The switch of claim 1, wherein said substrate supports said first, second and third regions.

8. The switch of claim 1, wherein said diaphragm is vertically aligned with said third region.

9. The switch of claim 8, wherein said diaphragm induces a strain in said quantum dot responsively to deflection thereof.

10. The switch of claim 9, wherein said quantum dot has an energy level aligned with a Fermi energy level of said first and second regions with substantially no deflection of said diaphragm.

11. The switch of claim 9, wherein said quantum dot has an energy level aligned with a Fermi energy level of said first and second regions upon a given deflection of said diaphragm corresponding to a given pressure to be sensed.

12. A pressure switch comprising:
    a semiconductor substrate having a thinned portion indicative of an active area which will deflect upon application of a force thereto, said substrate comprising carriers,
    a quantum dot formed in said substrate and within said active area whereby when said force is applied to said active area, said quantum dot and said substrate exhibit a transition to enable a current to flow through said substrate proportional to the magnitude of said applied force.

13. The pressure switch according to claim 12, wherein said substrate has an emitter region on one side of said active area an a collector region on the other side of said active area, and wherein said carriers are electrons.

14. The pressure switch according to claim 12 wherein said substrate has smaller bandgap regions than the bandgap of said active region, said smaller bandgap regions formed on both sides of said active region.

15. The pressure switch according to claim 12 including first and second electrodes. Coupled to said substrate and said first electrode positioned on one side of said active area with said second electrode positioned on said other side to enable a bias to be applied across said electrodes.

16. The pressure switch according to claim 15 wherein said electrodes are placed sufficiently close to said quantum dot to enable quantum funneling between said electrodes.

17. The pressure switch according to claim 12 wherein said transition of said quantum dot is to change the energy level of said dot.

18. The pressure switch according to claim 12 wherein said transition of said substrate upon application of a force thereto changes the effective access of carriers in said substrate to alter the funneling of carriers in and out of said quantum dot.

19. A pressure sensor responsive to an applied force, comprising:
- a substrate having a first energy band gap and a thinned area defining a deflectable diaphragm;
- a quantum dot formed in said substrate and aligned with said diaphragm and having an energy bandgap less than the first energy bandgap of said substrate;
- collector and emitter regions disposed on opposite sides of said quantum dot, said collector and emitter regions having respective energy band gaps smaller than the first energy bandgap of the substrate; the collector and emitter regions spaced sufficiently close to the quantum dot to enable electron tunneling therebetween in response to an applied pressure on a portion of said substrate of sufficient magnitude to induce a strain in the quantum dot, whereby energy levels of the quantum dot are aligned with these of the collector and emitter.

* * * * *